United States Patent [19]
Lur et al.

[11] Patent Number: 5,981,383
[45] Date of Patent: Nov. 9, 1999

[54] METHOD OF FABRICATING A SALICIDE LAYER OF A DEVICE ELECTRODE

[75] Inventors: Water Lur, Taipei; Tony Lin, Kaohshiung, both of Taiwan

[73] Assignee: United Microelectronics Corporation, Taiwan

[21] Appl. No.: 08/814,376

[22] Filed: Mar. 11, 1997

Related U.S. Application Data

[60] Provisional application No. 60/013,641, Mar. 18, 1996.

[51] Int. Cl.$^6$ ..................................................... H01L 21/70
[52] U.S. Cl. ......................... 438/655; 438/655; 438/656; 438/657; 438/660; 438/664; 438/683; 438/684; 438/652; 438/592; 438/574; 438/579
[58] Field of Search ..................................... 438/655, 652, 438/656, 657, 659, 660, 663, 664, 574, 570, 682, 683, 684, 592, 585–586

[56] References Cited

U.S. PATENT DOCUMENTS

| | | | |
|---|---|---|---|
| 4,818,715 | 4/1989 | Chao | 438/303 |
| 5,162,884 | 11/1992 | Liou et al. | 257/384 |
| 5,196,357 | 3/1993 | Boardman et al. | 438/305 |
| 5,214,305 | 5/1993 | Huang et al. | 257/413 |
| 5,518,942 | 5/1996 | Shrivastava | 438/525 |
| 5,646,056 | 7/1997 | Lin et al. | 438/539 |
| 5,656,546 | 8/1997 | Chen et al. | 438/586 |
| 5,753,559 | 5/1998 | Yew et al. | 438/684 |

OTHER PUBLICATIONS

Ho, et al., Formation of Self–Aligned TiSi$_2$ for Very Large Scale Integrated Contacts and Interconnects, *J. Vacuum Science and Technology* 1396–1401 (1987).

Inoue, et al., A New Cobalt Salicide Technology for 0.15 $\mu$m CMOS Using High–Temperature Sputtering and In–Situ Vacuum Annealing, *proceedings of the IEDM* 18.1 1–4 (1995).

Ohguro, et al., Nitrogen–Doped Nickel Monosilicide Technique for Deep Submicron CMOS Salicide, *Proceedings of the IEDM* 18.3 1–4 (1995).

*Primary Examiner*—Charles Bowers
*Assistant Examiner*—Thanh Nguyen
*Attorney, Agent, or Firm*—Rabin & Champagne, P.C.

[57] ABSTRACT

Salicide (self-aligned silicide) structures are formed using a process that does not form oxide spacer structures alongside polysilicon gate electrodes and wiring lines. A shaped polysilicon electrode is formed having protrusions extending beyond the sidewalls of the electrode. LDD source/drain regions are formed by ion implantation using only the polysilicon gate electrode as a mask, thereby forming LDD source drain/regions without using spacer oxide regions. Physical vapor deposition is used to deposit a metal layer having discontinuities at or adjacent the protrusions. A first rapid thermal anneal is performed to cause the metal to form a metal silicide over the polysilicon electrode. Unreacted metal is etched and then a second rapid thermal anneal is performed to convert the metal silicide to its lowest resistivity phase. Gate electrodes and wiring lines having this structure generally are formed having lower stress in the silicide layers, producing salicide structures having lower resistance than gate electrodes and wiring lines formed using conventional salicide techniques.

17 Claims, 5 Drawing Sheets

METHOD OF FABRICATING A SALICIDE LAYER OF A DEVICE ELECTRODE

This application claims priority from provisional application Ser. No. 60/013,641, filed Mar. 18, 1996.

BACKGROUND OF THE INVENTION

1. Field of the Invention

The present invention relates to semiconductor devices incorporating electrodes consisting of a layer of polysilicon covered by a self-aligned layer of metal silicide.

2. Description of the Related Art

As line widths and geometries for semiconductor devices are made smaller, the polysilicon electrodes that form the gates of MOS devices and wiring lines within semiconductor devices become undesirably resistive. Multilayer electrodes in which a layer of polysilicon is covered by one or more layers of metals or metal suicides are used to provide electrodes having a lower resistance tan electrodes consisting solely of polysilicon. Silicide electrodes may consist, for example, of a layer of polysilicon having a thickness of approximately 1000 Å to 3000 Å covered by titanium silicide to a thickness of greater than 100 Å.

A typical implementation of such a multilayer electrode is de so-called self-aligned silicide structure, illustrated in idealized form in FIGS. 1–4. FIGS. 1–4 show cross-sectional views of MOS devices at an early stage of manufacture. The illustrated MOS devices are formed on a P-type substrate 10 and include thick field oxide regions 12 to provide isolation from other, adjacent MOS devices. A gate oxide layer 14, formed by thermal oxidation, covers the active device region of the illustrated device and a polysilicon gate electrode 16 is formed on the gate oxide layer 14. The polysilicon gate electrode 16 is formed by depositing a layer of undoped polysilicon over the substrate, typically using low pressure chemical vapor deposition (LPCVD), implanting and activating impurities into the polysilicon to render it conductive, and patterning the polysilicon using photolithography. Polysilicon wiring line 18 is formed on the field oxide region 12 at the same time as the gate electrode 16.

Figure 1:
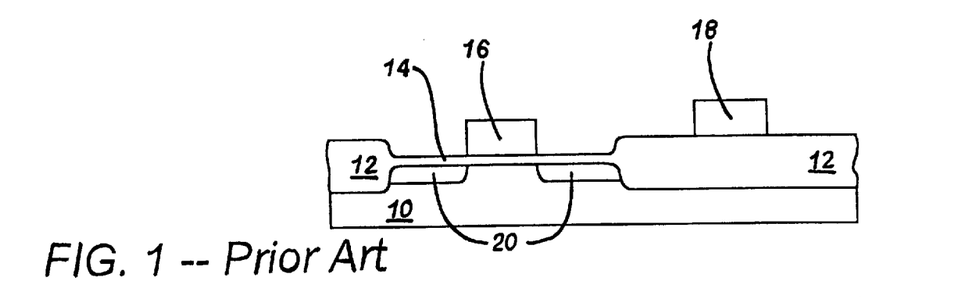
FIGS. 1–4 illustrate the process steps for forming a salicide structure in accordance with conventional teachings.

Doped source/drain regions 20 are formed on either side of the polysilicon gate electrode to define the channel region of the illustrated MOS transistor. Generally, a lightly doped drain (LDD) structure is used in small design rule MOS transistors of the type that are primarily used in modern memory and logic devices. LDD source/drain regions 20 are typically formed in a two step process, beginning with a relatively low level dopant implantation made self-aligned to a polysilicon gate electrode 16 as illustrated in FIG. 1. Subsequently, spacer oxide regions 22 (FIG. 2) are formed on either side of the gate electrode by first depositing a layer of CVD oxide over the FIG. 1 structure and then anisotropically etching back the oxide layer to expose the substrate over the source/drain regions 20. Etching back the CVD oxide layer produces the spacer oxide regions 22 on either side of the polysilicon gate electrode 16. This process also provides spacer regions 24 on either side of the polysilicon wiring line 18, if the wiring line 18 is exposed during the oxide deposition and etch back process. After the spacer oxide regions 22 are provided on either side of the polysilicon gate electrode 16, a second, heavier ion implantation is made into the source/drain regions 20 self-aligned to the spacer oxide regions 22 (not shown).

Figure 2:
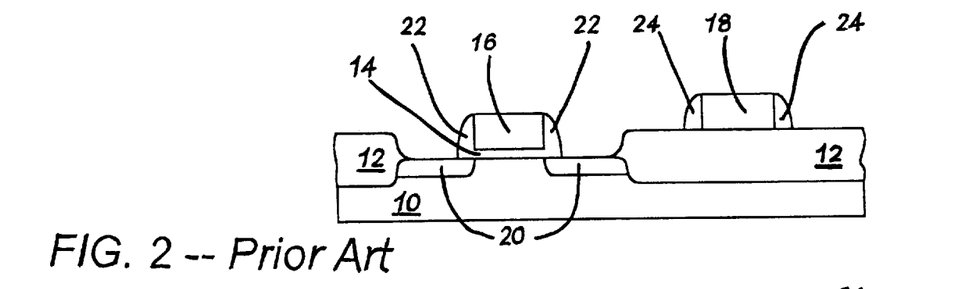
Figure 3:
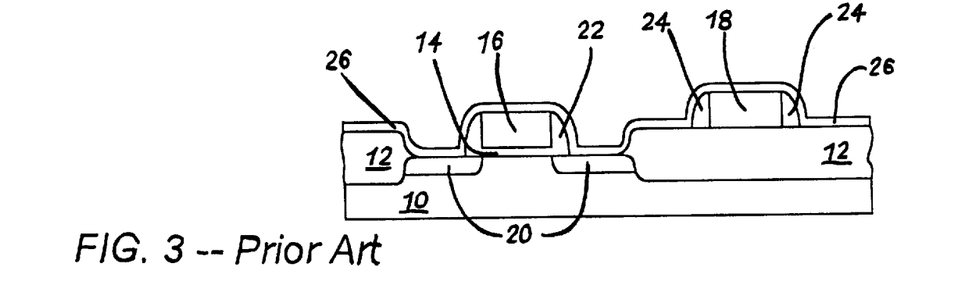

The structure illustrated in FIG. 2 includes a polysilicon gate electrode 16 and a polysilicon wiring line 18. For smaller line widths, even highly doped polysilicon is sufficiently resistive to diminish the performance of MOS circuits due to decreased signal levels and longer RC time constants. To reduce the resistance of these gate electrodes and wiring lines, further processing of the FIG. 2 device continues to convert the gate electrode 16 and wiring line 18 into silicide structures using self-aligned silicide (salicide) techniques. Although a variety of different silicides are known to be acceptable, the silicide most commonly used at his time is titanium silicide, and that structure is described herein. Referring now to FIG. 3, silicide lines are formed by first sputtering a layer of titanium over the surface of the device to a thickness of, for example, 500 Å. This titanium layer 26 is converted into titanium silicide at the surface of the polysilicon layers 16, 18 and at the exposed portions of the substrate, including the source/drain regions 20, in a two step process. In the first process step, the device is subjected to a rapid thermal anneal (RTA) by heating the device to a temperature of up to about 700° C. for about thirty seconds, converting the titanium layer 26 into titanium silicide (nominally $TiSi_2$) where the titanium layer is in contact with a silicon (crystalline or polycrystalline) surface. The device is then etched using a wet etch consisting of $H_2O_2$ and $NH_4OH$ diluted in water, removing unreacted titanium from the surface of the device, exposing the oxide regions of the device. Layers of titanium suicide 30, 32 are left over the polysilicon gate electrode 16 and over the wiring line 18. When the source/drain regions 20 are exposed during the silicidation process, titanium silicide regions 34 are also formed on the surface of the source/drain regions 20. Such titanium silicide regions 34 provide lower sheet resistance over the source/drain regions and provide better contacts to the source/drain regions 20. Titanium silicide contacts on the source/drain regions are thus preferred so long as the amount of silicon consumed in the silicidation process does not alter the gate performance or result in excessive junction leakage at the source/drain regions.

After the unreacted titanium is etched from the device, further processing is necessary to provide suitable self-aligned silicide (salicide) structures for the gate electrodes and wiring lines of the device. The process steps described to this point form a relatively high resistivity phase of titanium silicide on the silicon surfaces, so that the illustrated salicide structure does not have as low of resistivity as is desirable. It is accordingly necessary to expose the device to a second rapid thermal anneal at a temperature in excess of 800° C. for at least ten seconds to convert the titanium silicide to the lower resistivity phase of titanium silicide. The device is then subjected to further processing to complete the fabrication.

Figure 5:
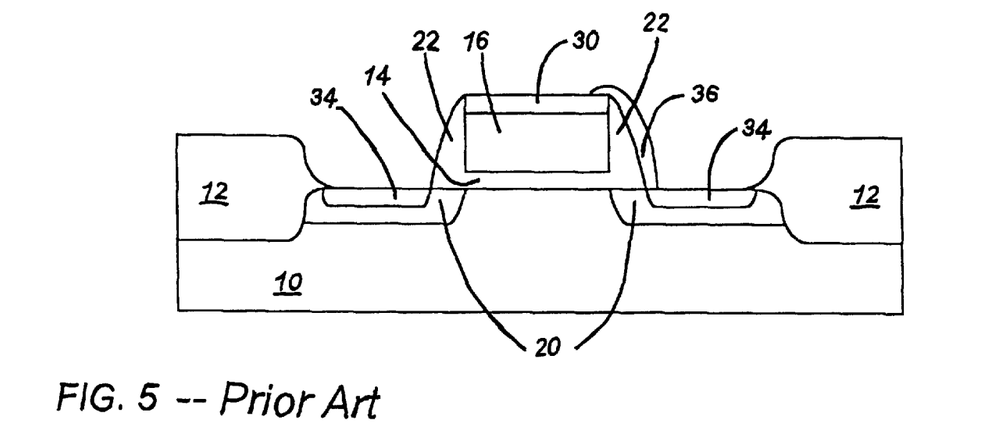
FIG. 5 illustrates a stinger formed on a transistor, shorting the gate to the drain of the transistor.

A number of the processing steps necessary to the formation of salicide structures are critical. For example, if the temperature control is poor for the initial RTA step of converting the titanium in contact with silicon to titanium silicide, then it is possible that the temperature of the device may get high enough for rapid silicon transport laterally along the titanium layer (26 in FIG. 3), which could convert titanium to titanium silicide in undesirable regions. For example, if silicon is transported along the portion of the titanium layer extending over the oxide spacers 22 on either side of the gate electrode 16, then a "stinger" may be formed bridging between the gate electrode and the source/drain regions 20. Such a stringer 36 bridging between the gate silicide layer 30 and the source/drain silicide region 34 is illustrated in FIG. 5. The formation of the FIG. 5 structure is obviously undesirable in that it shorts the gate to the source/drain region and renders the transistor inoperative.

For smaller device geometries, gate electrodes and wiring lines become narrower and it becomes increasingly more necessary to provide sufficiently low resistivity gate electrodes and wiring lines within memory and logic devices. On the other hand, as narrower gate electrodes and wiring lines are implemented, it is increasingly more difficult to form appropriate salicide electrode structures. In particular, it is difficult to provide the low resistivity phase of titanium silicide for narrow line width gate electrodes and wiring lines. It is accordingly desirable to develop better designs and more robust processing techniques for forming low resistance salicide structures.

SUMMARY OF THE PREFERRED EMBODIMENTS

A first aspect of the present invention provides a semiconductor circuit having a wiring line and a MOS device incorporating a gate electrode. The MOS device is formed over a semiconductor substrate. Each of the wiring line and the gate electrode have a salicide structure comprising a polysilicon lower layer having sidewalls and a layer of metal silicide overlying the polysilicon lower layer and extending laterally beyond each of the sidewalls of the polysilicon lower layer.

Another aspect of the invention provides a semiconductor circuit comprising a semiconductor substrate, a layer of insulating material on the semiconductor substrate, and a polysilicon structure on the layer of insulating material formed to have two sidewalls extending above the semiconductor substrate. A layer of conductive material is formed on the polysilicon structure extending laterally beyond both sidewalls of the polysilicon structure.

Still another aspect of the invention provides a semiconductor circuit comprising a semiconductor substrate and a layer of insulating material on the semiconductor substrate. A polysilicon structure is formed on the layer of insulating material so as to have two sidewalls extending above the semiconductor substrate. A layer of conductive material on the polysilicon structure extends laterally beyond both sidewalls of the polysilicon structure, and a first LDD source/drain region formed within the semiconductor substrate having a first lightly doped region and a first heavily doped region, the first lightly doped region having a boundary adjacent to a lower edge of a first one of the sidewalls of the polysilicon structure and the first heavily doped region having a boundary formed self aligned to a first edge of the layer of conductive material.

A different aspect of the present invention includes a method of forming a semiconductor device including a MOS transistor, including the steps of forming an insulator on a semiconductor substrate and forming a shaped polysilicon electrode on the insulator, the shaped polysilicon electrode having protrusions extending laterally over the semiconductor substrate. The method includes the further steps of forming, by ion implantation, LDD source/drain regions within the substrate on either side of the shaped polysilicon electrode using the protrusions of the shaped polysilicon electrode as a mask for the ion implantation to define the LDD source/drain region dopant distribution, and forming a metal silicide layer over the shaped polysilicon electrode.

For a particularly preferred embodiment of this aspect of the invention, the step of forming the shaped polysilicon electrode structure includes the steps of depositing a first layer of masking material on the semiconductor device and a second layer of masking material on the first layer of masking material and forming an opening by removing a portion of the first and the second layers of masking material. The second layer of masking material is etched laterally so that the opening is wider at the second layer than at the first layer. Polysilicon is deposited within the opening and the first and second layers of masking material are removed.

Still another aspect of the invention provides a method of making a semiconductor device by providing a semiconductor substrate and providing a layer of insulating material over at least a portion of the semiconductor substrate. A shaped polysilicon structure is formed over the layer of insulating material, the shaped polysilicon structure having protrusions extending laterally over a surface of the semiconductor substrate. A metal layer is deposited on the shaped polysilicon structure and the semiconductor device is annealed to produce a layer of metal silicide on the shaped polysilicon structure.

DETAILED DESCRIPTION OF THE PREFERRED EMBODIMENTS

Preferred embodiments of the present invention form semiconductor devices incorporating salicide (self-aligned silicide) structures in a process that preferably does not form oxide spacer structures alongside the polysilicon gate electrodes and wiring lines. Rather, a shaped polysilicon gate electrode is formed having an upper surface that can be converted to a silicide such as titanium silicide. The shaped polysilicon electrode preferably includes protrusions that extend away from the body of the electrode and extend over the silicon substrate. The polysilicon gate electrode may, for example, have a cross section in the shape of a "t". By first performing low dopant level ion implantation at an angle to reach the substrate regions shadowed by the protrusions from the gate electrode, an appropriate light ion implantation can be made for the source/drain regions. A subsequent, high dopant level ion implantation is made using an implantation direction perpendicular to the surface of the substrate so that the protrusions extending from the gate electrode act as a mask for the high dopant level ion implantation that completes the source/drain structure. In this way, a lightly doped drain (LDD) type structure can be formed for both of the source/drain regions without using spacer oxide regions. Gate electrodes and wiring lines having this structure are more consistently of a higher quality, and generally have lower resistance than gate electrodes and wiring lines formed using conventional salicide techniques.

The present inventors believe that the observed improvements in salicide electrode and wiring line formation and performance achieved by using preferred embodiments of the present invention relate to forming the salicide structure so that the silicide layer of the gate electrode is grown in such a manner as to have a low level of stress. It becomes increasingly difficult to form acceptable low resistivity salicide electrodes and wiring lines when these structures are made using polysilicon lines that are less than one half micron across. In particular, the resistivity of gate electrodes and wiring lines rises precipitously for line widths of less than one half micron. The increase in the resistivity for smaller line widths reflects the fact that the second annealing step conventionally used to produce the low resistivity phase of silicide can be ineffective for such narrow line widths. To understand why his happens, it is useful to consider a more realistic model of what happens during the formation of conventional salicide structures.

Figure 4:
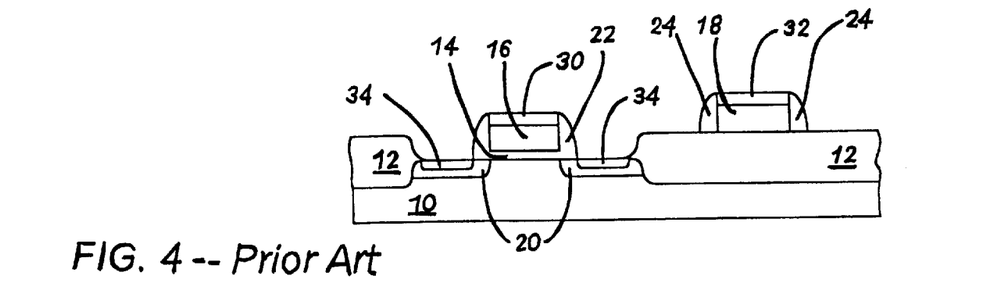
Figure 6:
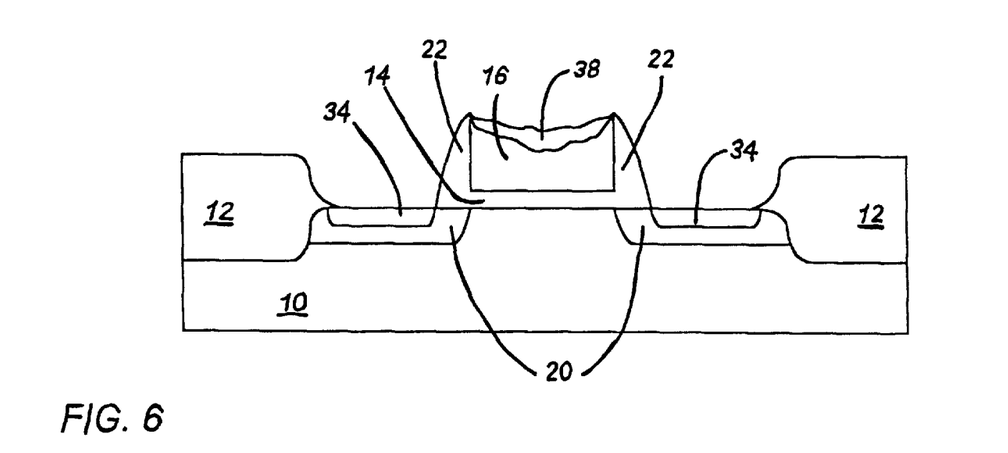
FIG. 6 illustrates a difficulty in producing acceptable salicide structures.

FIG. 6 illustrates a mechanism that is believed to explain the difficulty in converting silicide layers formed on narrow line width polysilicon layers to the low resistivity silicide phase. FIG. 4, discussed above, shows a well defined titanium silicide layer extending uniformly across a polysilicon gate electrode. This is an idealized representation of what is produced during the rapid thermal anneal that converts titanium in contact with a layer of silicon into a layer of titanium silicide. The inventors have observed that this process step more typically forms a titanium silicide structure 38 such as that illustrated in FIG. 6. Near the edge of the polysilicon gate electrode, the gate oxide spacers 22 appear to "clamp" the edges of the titanium silicide layer 38, limiting the growth of the titanium silicide layer which typically must expand to a thickness greater than the silicon layer consumed during the growth process. Thus, titanium silicide grows most freely near the center of the gate electrode so that the thickest part of the titanium silicide layer 38 is formed above the center of the polysilicon gate electrode 16. Titanium silicide along the edges of the layer 38 has a high level of stress, as it is formed, while the more central portion of the titanium silicide has a relatively lower level of stress. If the width of the titanium silicide layer 38 is sufficiently small, then a considerable level of stress will exist even at the center of the titanium silicide layer 38. If too high of a stress level exists across the entire titanium silicide layer as it is formed, then a subsequent annealing step may not be successful in converting enough of the titanium silicide layer 38 to the low resistivity phase. A salicide structure in which the as grown silicide layer has too high of a level of stress may thus produce an undesirably resistive salicide structure which is poorly suited for use as a gate electrode or a wiring line.

The present inventors accordingly believe that, at least for small line widths, it is desirable to form salicide structures using silicide layers having a reduced stress level. Salicide structures that are formed incorporating a reduced stress silicide layer and a preferred method of making such structures are now described with reference to FIGS. 7–15. While these figures illustrate particularly preferred embodiments of the present invention within MOS transistors and wiring lines in a particular configuration of a semiconductor device, embodiments of the present invention can be used to form gate electrodes and wiring lines in a wide variety of semiconductor devices. In addition, while the description of the following embodiments emphasizes the formation of NMOS devices, salicide structures in accordance with the present invention may be implemented to advantage in PMOS devices as well. This is true whether the polysilicon of the PMOS gate is doped N-type or P-type. Although it is possible to use the salicide structure described herein only for the gate electrodes (or, conversely, only for the wiring lines) of a device, it is presently believed that it is most desirable to use the described salicide structure for all of the first level polysilicon lines, at least for those devices in which high conductivity electrodes and wring lines are desirable.

Figure 7:
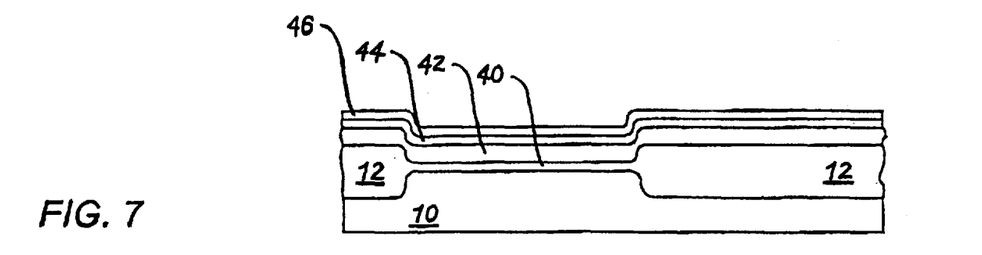
FIGS. 7–15 illustrate stages in the manufacture of MOS devices incorporating salicide structures in accordance with the present invention.

FIG. 7 illustrates in cross section a small portion of a semiconductor circuit incorporating a MOS device at an early stage in the manufacturing process. A P-type substrate 10 is provided and device isolation regions such as field oxide regions 12 are provided as necessary. A pad oxide 40 is grown thermally or deposited by chemical vapor deposition (CVD) over the active device regions of the device to a thickness of between about 50 to 300 Å. The channel threshold adjust implantation is then performed in the typical manner using, for example, boron or boron fluoride ions for NMOS devices or, for example, arsenic or phosphorus ions for PMOS devices to a dose of between about $3\times10^{11}$ ions/cm$^2$ to about $5\times10^{13}$ ions/cm$^2$ at an energy of between about 5 to 50 KeV. Next, a series of layers of material are deposited at least over the regions of the device where salicide gate structures and wiring lines are to be formed. The series of layers will be patterned into a form or mask structure to be used in forming a shaped polysilicon line which will undergo further processing to form a salicide structure. As such, it is possible to use a variety of different combinations of layers to provide the desired form or mask structure. In a preferred embodiment, a layer 42 of silicon nitride Si$_3$N$_4$ is deposited first, a layer 44 of silicon oxide SiO$_2$ is deposited next, and then a second layer 46 of silicon nitride is deposited. Each of these layers can be deposited using one of the conventional CVD processes well known in the art, with each of the layers having a thickness of between about 1000 Å A to 3000 Å. The total thickness of the layers is preferably about 3000 Å, but this may be readily varied to form salicide structures of different thicknesses.

Figure 8:
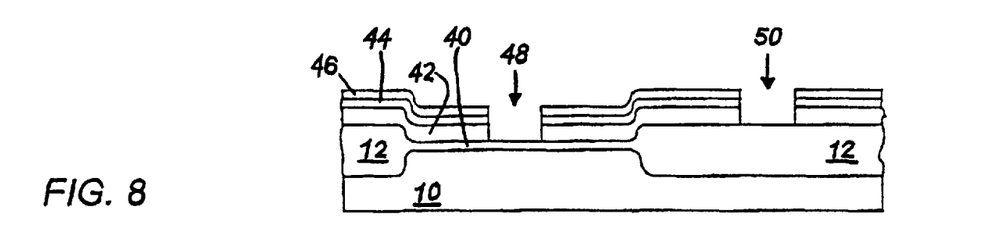

After the layers 42, 44, 46 that will be formed into the polysilicon form have been deposited, photolithography is performed to provide openings through the three layers at the regions where salicide structures are to be formed. This photolithography may use a mask that is the reverse of the conventional first polysilicon mask pattern so that, after the photoresist is exposed and removed, openings through the photoresist will leave the layer 46 exposed over the regions where the salicide structures are to be formed. Then, the layers 42, 44 and 46 are etched in a substantially anisotropic manner using, for example, plasma etching with SF$_6$ and He for the Si$_3$N$_4$ layers 46 and 42 and using CHF$_3$ and O$_2$ for the SiO$_2$ layer 44. After the photoresist is stripped, the device will appear as shown in FIG. 8 with an opening 48 over the illustrated active device region and an opening 50 on top of the field oxide region 12. A lateral etch of the middle SiO$_2$ layer 44 is then performed by dipping the device in a dilute HF solution (e.g. HF:H$_2$O=1:10) for between about two to about seven minutes. This will result in an undercut 52 being formed laterally across layer 44 within opening 48 and an undercut 54 being formed across layer 44 within opening 50. The undercut etch will also result in the removal of the pad oxide 40 where it is exposed to the dilute HF solution, as well as a slight undercut beneath layer 42. The extent of the undercut of layer 44 determines how far polysilicon protrusions will overhang the substrate for the shaped polysilicon structure that is to be formed. Accordingly, as will be described in greater detail below, the extent of the undercut will establish the position of the edge of the heavily doped portion of the LDD source/drain regions of the device. Thus, the extent of the undercut may desirably be adjusted in accordance with the particular structure that is desired for the source/drain regions. The presently preferred extent of the undercuts 52, 54 is between about 500 Å to about 2000 Å.

Figure 9:
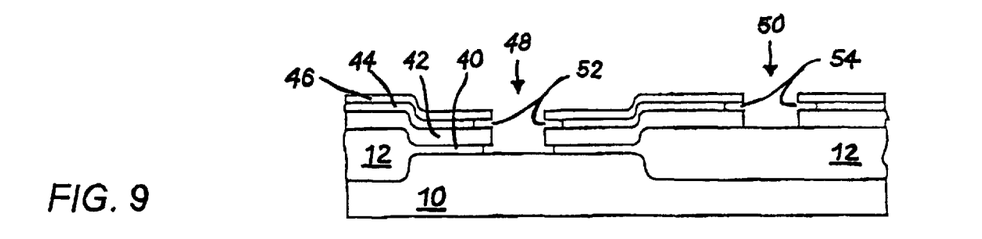
Figure 10:
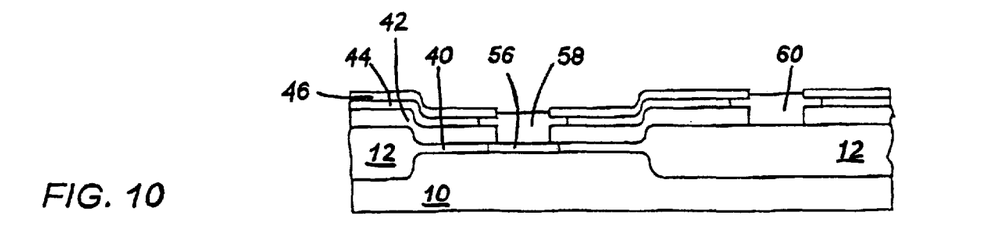
Figure 11:
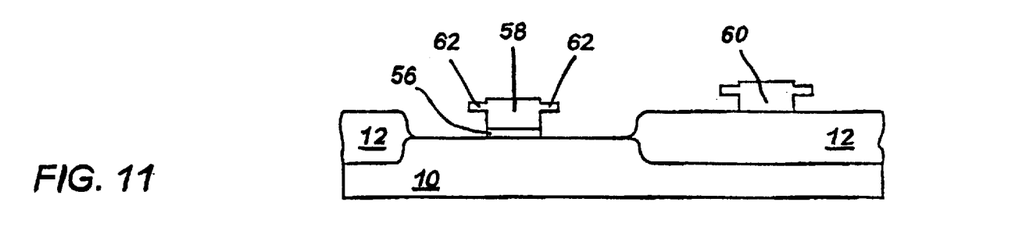

After the undercut etching has been performed, the substrate 10 will be exposed within the opening 48. A gate oxide layer 56 (FIG. 10) is then thermally grown in the conventional manner to a thickness of between about 30 Å to about 300 Å. Polysilicon is deposited by CVD to a sufficient depth to extend above the first layer 42 and more preferably to extend above layer 44. The thickness of the polysilicon layer will typically be about the thickness of the three layers 42, 44 and 46. CVD polysilicon will readily deposit within the undercut regions 52, 54 (FIG. 9). The polysilicon structures are preferably doped in situ during deposition by the addition of the appropriate dopant gas during the CVD process, or the polysilicon structures may alternately be doped later by ion implantation and thermal activation. Although it is not illustrated, the polysilicon deposition process typically leaves excess polysilicon on the insulating layer and above the gate structure. The CVD polysilicon is then etched back to expose layer 46 to form shaped polysilicon structures 58, 60 as shown in FIG. 10. It should be noted that, if trench isolation structures were used instead of the illustrated LOCOS structures, excess deposited polysilicon might be removed by a chemical mechanical polishing (CMP) process, rather than by an etch back process. The stack of layers 42, 44, 46 is then removed using conventional etchants, such as hot $H_3PO_4$ for the $Si_3N_4$ layer 46 and 42 and a dilute HF (in $H_2O$) solution for the $SiO_2$ layer 44, to provide the structure shown in FIG. 11.

Figure 12:
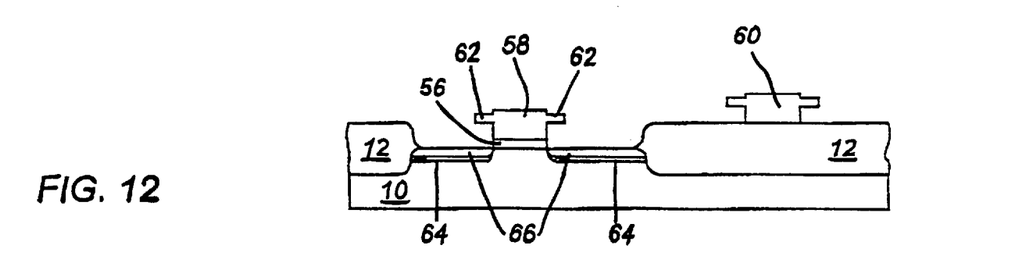

Next, the anti-punchthrough implantations are formed and the lightly doped portions of the source/drain regions are formed. These implantations are made in a self-aligned manner using the protrusions 62 extending from the polysilicon electrode 58 as a mask during oblique angle ion implantation. The implantation angles are readily determined by the length by which the protrusions 62 extend over the surface of the substrate 10 and the angle necessary for the implantation to have "line of sight" to the base of the polysilicon electrode 58. Typically, the implantation angle will be between about 15° to about 60°. The anti-punchthrough implantations 64 and lightly doped drain implantations 66 are made in the well known manner using implantations of boron, boron fluoride, arsenic or phosphorus ions to a dose of between about $5\times10^{12}$ ions/cm² to about $1\times10^{15}$ ions/cm² at an energy of between about 2 to 80 KeV. The resulting structure is illustrated in FIG. 12.

The heavily doped portions of the source/drain regions are then formed by implantation perpendicular to the surface of the substrate (i.e., no tilt angle), using the protrusions 62 extending from the polysilicon electrode 58 as a mask for the heavy implantation. Because the edge of heavily doped region is determined by where the "shadows" of the protrusions 62 fall on the substrate, the heavily doped regions (68, FIG. 13) are formed self-aligned to the protrusions. Typically, the heavily doped regions are formed by an implantation of boron, boron fluoride, arsenic, antimony or phosphorus ions to a dose of between about $1\times10^{14}$ ions/cm² to about $1\times10^{16}$ ions/cm² at an energy of between about 5 to 200 KeV. The source/drain regions are then activated by heating the device to a temperature of between about 800° C. to 1100° C. for between 10 seconds (RTA, higher temperature) and 60 minutes (lower temperature).

Next, the silicide portion of the salicide structure is formed. As is known in the art, acceptable silicide layers can be formed using a number of different base metals, including titanium, cobalt, nickel, platinum and palladium. At the present time, titanium silicide is the most widely implemented, but both cobalt and nickel silicides are believed to have desirable characteristics for reduced line width devices. The processing steps characteristic to each of these different silicides are well known and reported in the literature. Accordingly, while the following description is made in terms of titanium silicide, other silicides can also be utilized in this process, as is known in the art.

Figure 13:
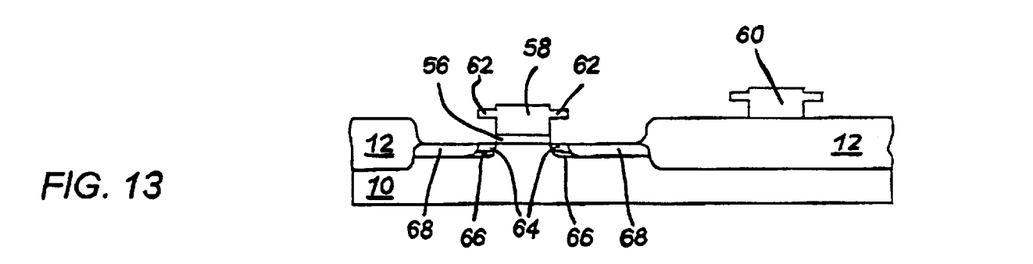
Figure 14:
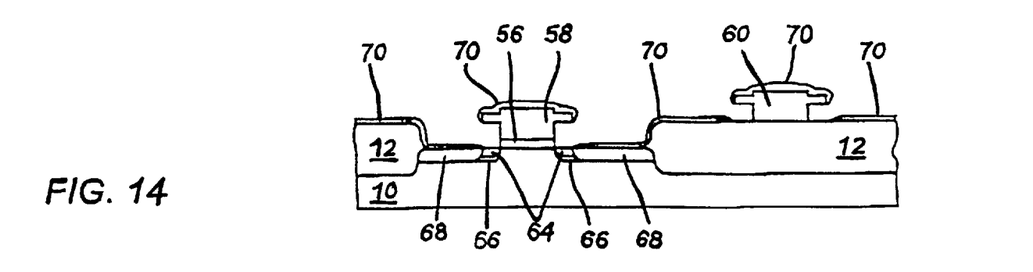

After thermal activation of the dopants, the device is as illustrated in FIG. 13. The native (thermal) oxide formed in this process is removed using a dilute HF solution, and then a thin layer of the metal to be silicided is deposited over the device using physical vapor deposition (e.g., sputtering). In the illustrated embodiment, titanium is deposited to a thickness of between about 200 Å to 800 Å, producing thin layers 70 over the surface of the device, as shown in FIG. 14. The thickness of metal to be deposited is determined by balancing the need to deposit sufficient titanium to form a uniform layer with sufficient metal to provide a desirably conductive titanium silicide layer against the need to leave sufficient silicon below the silicided structures. Excessive silicon consumption during silicidation can lead to unacceptable junction leakage from the source/drain regions, among other problems. As is illustrated in FIG. 14, there is poor metal coverage in the region where the substrate is shadowed by the protrusions 62 from the polysilicon electrode 58.

The discontinuities in the metal layer 70 adjacent the gate electrode ensue that bridging (such as that illustrated in FIG. 5) should not occur. Thus, it is possible to perform the initial silicidation at a temperature sufficiently high to produce the low resistivity phase of titanium silicide. Accordingly, titanium silicide could be formed by performing a rapid thermal anneal (RTA) of the FIG. 14 device at a temperature of about 750° C. for about twenty seconds. A subsequent etch would remove the unreacted titanium. In this process, however, there may be considerable silicon transport along the titanium layer 70, which could result in titanium silicide stringers extending over portions of the device in an undesirable fashion. It is therefore still likely preferred that silicidation be performed in a two-step process. Regardless, the existence of the discontinuities in the sputtered titanium layer reduce the criticality of the temperature and other controls for the processing steps in the two-step annealing process. Preferably, the FIG. 14 structure is subjected to a first RTA at a temperature within the range of 600–750° C., more preferably of about 700° C., for 10 to 120 seconds, more preferably 20 to 60 seconds, in a nitrogen ambient. For cobalt silicide, a temperature of about 550–600° C. is preferably used for the initial silicidation step. Titanium nitride, titanium-rich titanium silicide, titanium oxide and unreacted titanium are then etched from the surface of the device in a solution of $NH_4OH$, $H_2O_2$ and $H_2O$ (for example, at a ratio of 1:1:5), leaving titanium silicide layers 72 over the heavily doped portions 68 of the source/drain regions. Titanium silicide regions 74, 76 also remain over the polysilicon portion 58 of the gate electrode and over the polysilicon portion 60 of the wiring line. The remaining titanium silicide is then converted to the lower resistivity phase in a RTA at a temperature within a range of about 700° C. to 900° C. for between about 10 to 60 seconds. Most preferably, the second RTA is performed at a temperature of about 850° C. for about 20 seconds.

In this embodiment, the titanium silicide regions 74, 76 are less constrained than in the conventional salicide process. Ideally, the titanium silicide will be essentially unconstrained in the vertical direction, since there are no spacer oxide regions to vertically compress the titanium silicide in the regions where the silicon is consumed The titanium silicide regions 74, 76 are thus formed with much lower stress levels than occur in the conventional silicidation process (illustrated in FIGS. 1–4). There will still be stress introduced into the titanium silicide layer along the horizontal direction due to the mismatch between the titanium silicide and the underlying (unconsumed) silicon, but the structure should nevertheless have a much reduced stress level after the initial silicidation process than in conventional salicide processes. As such, the second RTA has a much improved likelihood of converting the titanium silicide to the preferred low resistivity phase. The titanium silicide structures 74, 76 have approximately the same width (i.e., approximately 500 Å to approximately 2000 Å) as the silicon protrusions 62 that exist prior to the silicidation process.

Figure 15:
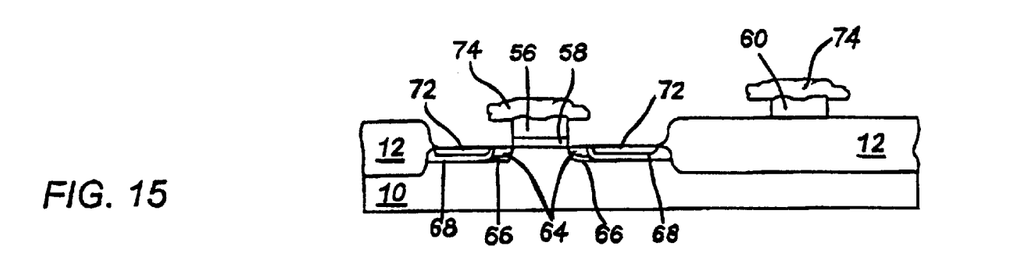

Subsequent processing proceeds in the conventional manner, with the deposition of a interpolysilicon or premetal dielectric layer such as atmospheric pressure CVD SiO$_2$ or borophosphosilicate glass (BPSG) over the FIG. 15 structure. Thus, CVD SiO$_2$ or BPSG will typically be disposed adjacent the lower sidewalls of the polysilicon electrode 58 (between the protrusions of silicide layer 74 and the substrate 10) and adjacent the lower sidewalls of polysilicon wiring line 60 (between the protrusions of silicide layer 76 and the field oxide 12). Vias are formed through the CVD SiO$_2$ or BPSG down to the silicide regions as necessary, forming polysilicon or metal contacts and first metal or second polysilicon wiring lines and interconnects. The remaining structures and processes are conventional and so are not described further herein. It should be noted that certain configurations of gate electrodes, wiring lines and silicided regions of the substrates sometimes include additional layers of conductive materials such as refractory metals or nitrides of metals (e.g., titanium nitride) formed on top of the salicide structure.

The present invention has been described in terms of certain preferred embodiments. The invention is not, however, limited to the specific embodiments described, but also includes such modifications and variations as fall within the scope of the following claims.

What is claimed:

1. A method of making a semiconductor device, comprising the steps of:

providing a semiconductor substrate and providing a layer of insulating material over at least a portion of the semiconductor substrate;

providing a first layer of a first material over the layer of insulating material;

providing a second layer of a second material over the first layer of the first material;

patterning the first and second layers to form an opening in the first and second layers that exposes a portion of the layer of insulating material;

laterally etching the second layer from within the opening such that the opening becomes wider at the second layer and above the first layer;

forming a shaped polysilicon structure over the layer of insulating material and within the opening, the shaped polysilicon structure having protrusions extending laterally over surfaces of the first layer and the semiconductor substrate;

removing the first layer and the second layer;

depositing a metal layer on the shaped polysilicon structure; and annealing the semiconductor device to produce a layer of metal silicide on the shaped polysilicon structure.

2. The method of claim 1, wherein the metal layer is deposited by physical vapor deposition.

3. The method of claim 1, wherein the metal layer is deposited in such a manner that there is a discontinuity in the deposited metal layer at or near the protrusions of the polysilicon structure.

4. The method of claim 1, wherein the step of annealing the semiconductor device consists of a rapid thermal anneal performed at a temperature within the range of 600° C. to 750° C.

5. The method of claim 4, wherein the rapid thermal anneal is performed at a temperature of about 700° C.

6. The method of claim 4, wherein the rapid thermal anneal continues for a time between 10 to 120 seconds.

7. The method of claim 5, wherein the rapid thermal anneal continues for 20 to 60 seconds.

8. The method of claim 1, further comprising the step of etching the device in a solution of NH$_4$OH, H$_2$O$_2$ and H$_2$O subsequent to the step of annealing the semiconductor device.

9. The method of claim 8, further comprising a second step of annealing the semiconductor device at a temperature of about 850° C. for about 20 seconds.

10. The method of claim 1, further comprising a second step of annealing the semiconductor device at a temperature of greater than 700° C. for about 10 to about 120 seconds.

11. A method of forming a semiconductor device including a MOS transistor, the method of making the MOS transistor comprising the steps of:

forming an insulator on a semiconductor substrate;

forming a shaped polysilicon electrode on the insulator, the shaped polysilicon electrode having protrusions extending laterally over the semiconductor substrate, wherein the step of forming the shaped polysilicon electrode includes:

depositing a first layer of masking material on the semiconductor device and a second layer of masking material on the first layer of masking material;

forming an opening by removing a portion of the first and the second layers of masking material;

laterally etching the second layer of masking material so that the opening is wider at the second layer than at the first layer;

depositing polysilicon within the opening and over the second layer of masking material;

removing excess polysilicon to expose an upper layer of masking material; and removing the first and second layers of masking material forming by ion implantation LDD source/drain regions within the substrate on either side of the shaped polysilicon electrode using the protrusions of the shaped polysilicon electrode as a mask for the ion implantation to define the LDD source/drain region dopant distribution; and forming a metal silicide layer over the shaped polysilicon electrode.

12. The method of claim 11, further comprising the step of depositing a third layer of masking material on the second layer of masking material before the step of forming an opening.

13. The method of claim 12, wherein the first and third layers of masking material are formed of the same material.

14. The method of claim 13, wherein the second layer of masking material comprises silicon oxide.

15. The method of claim 12, wherein the polysilicon is deposited by chemical vapor deposition and is doped in situ.

16. The method of claim 11, wherein the step of forming a metal silicide layer comprises the steps of:

depositing a layer of metal on the semiconductor device;

annealing the semiconductor device to form metal silicide on the shaped polysilicon electrode; and etching unreacted metal from the semiconductor device.

17. The method of claim 16, wherein the deposited metal is selected from the group consisting of titanium, cobalt, nickel platinum and palladium.

* * * * *